United States Patent [19]

Battey et al.

[11] 4,148,705
[45] Apr. 10, 1979

[54] GAS PLASMA REACTOR AND PROCESS

[75] Inventors: James F. Battey, Los Altos; Richard L. Bersin, San Lorenzo; Richard F. Reichelderfer, Castro Valley; Joseph M. Welty, Fremont, all of Calif.

[73] Assignee: Dionex Corporation, Hayward, Calif.

[21] Appl. No.: 774,239

[22] Filed: Mar. 4, 1977

Related U.S. Application Data

[63] Continuation-in-part of Ser. No. 663,271, Mar. 3, 1976, abandoned.

[51] Int. Cl.² .................... C23C 15/00; C23F 1/00
[52] U.S. Cl. .................... 204/192 E; 156/643; 156/665; 204/298; 250/531
[58] Field of Search .......... 204/164, 192 E, 298; 250/531; 156/643, 665

[56] References Cited

U.S. PATENT DOCUMENTS

| | | | |
|---|---|---|---|
| 3,816,198 | 6/1974 | LaCombe | 156/643 |
| 3,984,301 | 10/1976 | Matsuzaki et al. | 204/192 E |
| 3,994,793 | 11/1976 | Harvilchuck et al. | 204/192 E |
| 4,026,742 | 5/1977 | Fujino | 156/643 |

OTHER PUBLICATIONS

H. A. Clark, "Plasma Etching Process", *IBM Tech. Disc. Bull.*, vol. 17, p. 1955 (1974).
G. E. Alcorn, "Plasma Etching Via Holes In Sputtered Quartz", *IBM Tech. Disc. Bull.*, vol. 17, pp. 2701-2702 (1975).
L. Maissel et al., Editors, "Handbook of Thin Film Technology", McGraw-Hill, N.Y., (1970), pp. 4-6, 4-13, 7-50, 7-51.

*Primary Examiner*—Aaron Weisstuch
*Attorney, Agent, or Firm*—Flehr, Hohbach, Test, Albritton & Herbert

[57] ABSTRACT

Process and apparatus for carrying out a reaction, such as etching aluminum, in the glow discharge of a gas plasma. The plasma is formed between a pair of closely spaced electrodes, and a distributed impedance is provided in series with the plasma to assure uniform distribution of the ionizing current and the glow discharge of the plasma throughout the region between the electrodes.

16 Claims, 3 Drawing Figures

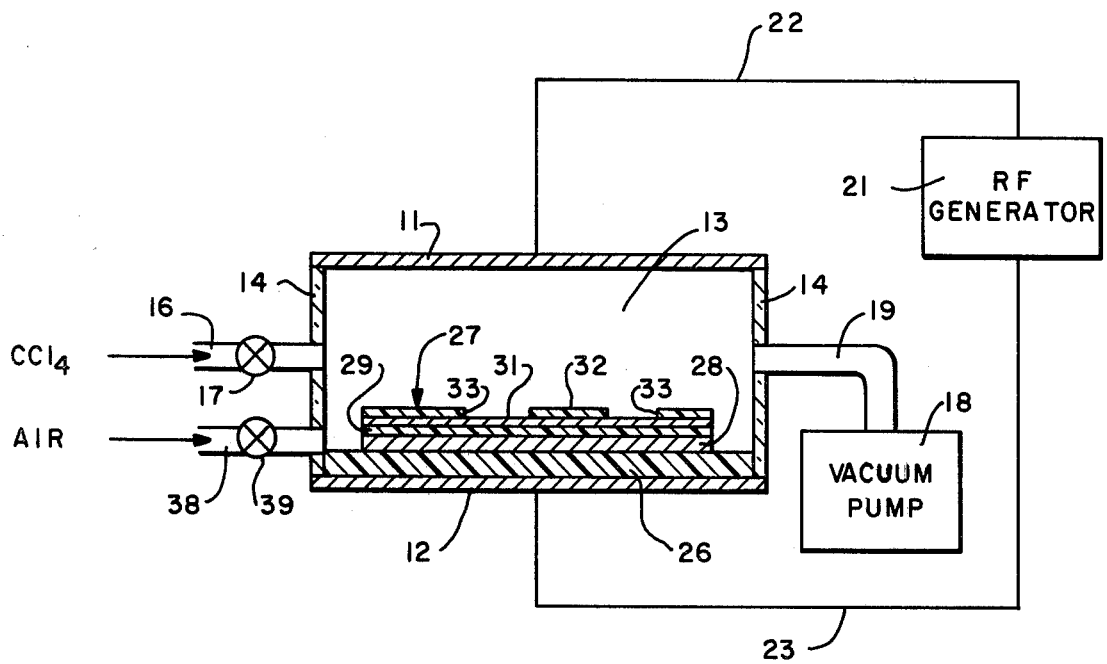
FIG.—1
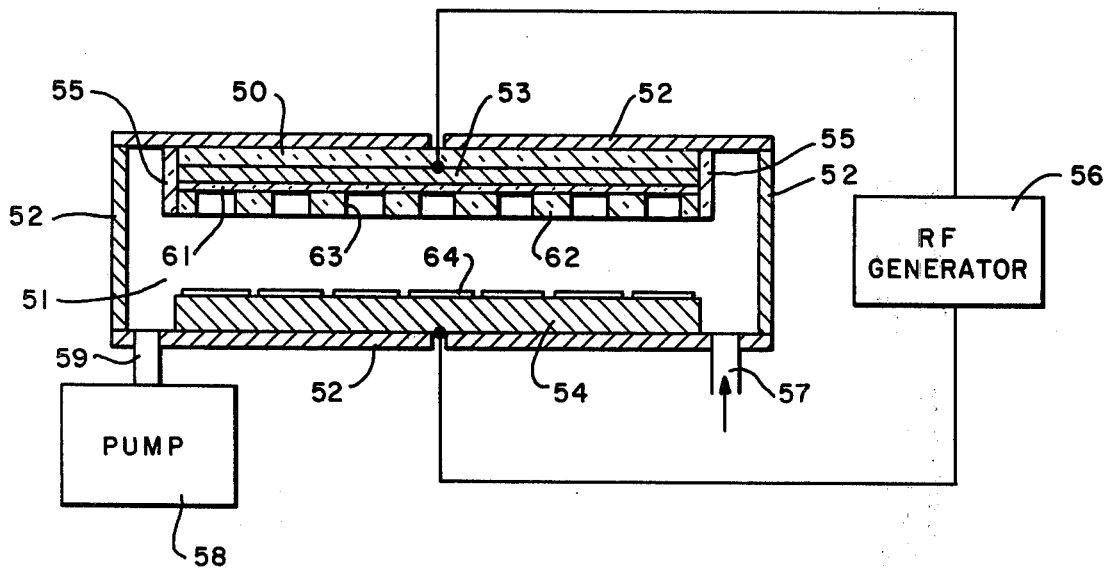
FIG.—2
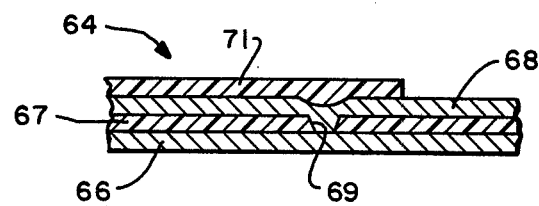
FIG.—3

GAS PLASMA REACTOR AND PROCESS

CROSS-REFERENCE TO RELATED APPLICATION

This application is a continuation-in-part of Ser. No. 663,271, filed Mar. 3, 1976, now abandoned.

BACKGROUND OF THE INVENTION

This invention pertains generally to chemical reactors and more particularly to a process and apparatus for carrying out chemical reactions in the glow discharge region of a plasma.

In plasma reactors of the type to which the invention pertains, a reagent gas is excited with radio frequency energy in a reaction chamber. Such reactors are utilized in a wide variety of applications, including chemical etching of various metals such as aluminum.

It has been observed that in the plasma reactors of the prior art, the ionizing current tends to be concentrated toward the walls of the chamber in a manner analogous to the electrical skin effect, or tendency of high frequency currents to flow near the surfaces of metal conductors. In a plasma reactor, the ionized and excited species which form the plasma are created primarily in the region where the current flows. In this same region, visible light commonly known as a glow discharge is produced by the decay of various species in electronically excited states. The life of some excited species is apparently so short that these species do not have time to diffuse out of the region where the current is concentrated. It has been found that certain reactions, such as aluminum etching, can only be carried out in the glow discharge region, and when the glow discharge occurs only near the walls of the reactor, only a small part of the chamber can be utilized.

SUMMARY AND OBJECTS OF THE INVENTION

In the process and apparatus of the invention, the ionizing current is substantially uniform throughout the region between the electrodes, and reactions can be carried out anywhere in this region. Uniform current distribution is attained by making the spacing between the electrodes small and placing a distributed impedance in series with the plasma to make the impedance through the center of the plasma substantially the same as the impedance through the outer portion. In one preferred embodiment, the electrodes are planar and the distributed impedance comprises a sheet of dielectric material between the electrodes.

It is in general an object of the invention to provide a new and improved process and apparatus for carrying out chemical reactions in a gas plasma.

Another object of the invention is to provide a process and apparatus of the above character in which the ionizing current and the glow discharge of the plasma are distributed throughout the region between the electrodes.

Another object of the invention is to provide a process and apparatus of the above character which are particularly suitable for etching aluminum.

Additional objects and features of the invention will be apparent from the following description in which the preferred embodiments are set forth in detail with the accompanying drawing.

BRIEF DESCRIPTION OF THE DRAWING

FIG. 1 is a schematic illustration of one embodiment of apparatus particularly suitable for etching aluminum according to the invention.

FIG. 2 is a schematic illustration of another embodiment of wafer processing apparatus according to the invention.

FIG. 3 is an enlarged, fragmentary sectional view of a wafer of a type suitable for processing in the apparatus of FIG. 2.

DESCRIPTION OF THE PREFERRED EMBODIMENTS

As illustrated in FIG. 1, the apparatus includes a pair of spaced apart, generally planar electrodes 11, 12. The electrodes are fabricated of an electrically conductive material, and they are maintained in a generally parallel relationship. In this embodiment, the electrodes form the top and bottom walls of a chamber 13 which also has a cylindrical side wall 14 fabricated of a suitable insulative material such as quartz. Electrode 11 is removably mounted on the upper portion of side wall 14 to permit access to the chamber.

Means is provided for passing a reagent gas through chamber 13. This means includes a gas inlet 16 having a flow control valve 17 and a vacuum pump 18 connected to an outlet 19. In the embodiment illustrated, the inlet and outlet are mounted on side wall 14 at opposite sides of the chamber, but it will be understood that they can be located at any suitable position in the chamber, for example, on electrode 11. Suitable reagent gases for etching materials such as aluminum include chlorine and chlorine containing hydrocarbons, and particularly good results have been obtained with carbon tetrachloride ($CCl_4$). For etching silicon compounds and other materials, suitable gases include $CF_4$, $CHF_3$, and other fluorine containing compounds.

The flow rate of the reagent gas is adjusted so that the gas remains in the chamber for an optimum time to balance the buildup and decline of the active species which do the etching, but not so long that the by-products of the reaction seriously inhibit the reaction. With $CCl_4$ a residence time on the order of 1/25 second has been found to give particularly satisfactory results. In one preferred embodiment, $CCl_4$ is supplied to a 300 cc chamber at a flow rate on the order of 40–70 cc/min at atmospheric pressure, and pump 18 removes the gas from the chamber at a rate on the order of 7,500 cc/sec to provide a residence time of 300 cc/7500 cc/sec or 1/25 sec, and a pressure in the chamber on the order of 0.1 torr. Pressures in the range of 0.05–0.5 torr have been found to give satisfactory results.

Means is provided for energizing electrodes 11, 12 to produce an electric field for ionizing the gas in chamber 13. This means includes a radio frequency generator 21 which is connected to electrodes 11, 12 by leads 22, 23. In one preferred embodiment, the generator operates at a frequency on the order of 13.56 MHz and delivers on the order of 50 watts, although other frequencies and power levels can be utilized, if desired.

As noted above, in order to make the distribution of current and the ionization of the plasma substantially uniform through the region between the electrodes, the electrode spacing is made small and a distributed impedance is placed in series with the plasma. By making the distributed impedance large compared to the impedance of the plasma, the current through the center of the plasma is made substantially the same as that through the outer portion of the plasma. With the impedance of a path through the center of the plasma small compared to a path from the center to the outside wall of the chamber, the current distribution throughout the plasma is also substantially uniform.

When circular electrodes having a diameter of eight inches are utilized for etching aluminum and a power of 50 watts is applied to the electrodes, satisfactory results have been obtained with an electrode spacing of one inch or less, with a spacing on the order of 0.4 inch giving particularly satisfactory results. Generally, the distance between the electrodes should be substantially less than the electrode diameter, and a ratio of electrode diameter to spacing of at least 3:1 is preferred.

In the embodiment of FIG. 1, a plate 26 of dielectric material is placed on electrode 12 and serves as a distributed impedance. Suitable dielectric materials include quartz, Pyrex glass and other glasses, and satisfactory results have been obtained with a Pyrex glass plate having a thickness on the order of 1/16 inch. In addition to helping to spread the ionizing current throughout the plasma, the presence of the dielectric material also appears to force some of the ionizing current to pass through a wafer or other workpiece in the plasma.

In the embodiment illustrated, a semiconductor wafer 27 rests upon the plate of dielectric material. However, the relative positions of the dielectric material and the wafer do not appear to be critical as long as they are in series between the electrodes. Thus, for example, the dielectric material can be placed adjacent to the upper electrode, and the wafer can be placed directly on the lower electrode.

For purposes of illustration, wafer 27 is shown as comprising a substrate 28 of semiconductor material in which regions of suitable impurity are formed in a manner conventional in the formation of semiconductor devices. A layer of $SiO_2$ 29 is shown overlying the substrate, and a layer of aluminum 31 is formed on the $SiO_2$ layer. A layer of photoresist 32 is formed on the aluminum, and windows 33 are formed in the photoresist to expose regions of the aluminum which are to be removed.

Means is also provided for admitting an oxidizing gas such as oxygen or air or a reducing gas such as hydrogen to chamber 13 during the aluminum etching cycle. This means includes a gas inlet 38 having a flow control valve 39 connected to side wall 14. The addition of an oxidizing gas serves to permit buildup of oxygen-containing aluminum compounds on the exposed surfaces of the aluminum, and these aluminum compounds aid in preventing undercutting of the aluminum. The addition of a gas containing hydrogen permits aluminum hydride species to build up on the exposed surfaces of the aluminum, and these aluminum compounds also aid in preventing undercutting of the aluminum. It has been found that air is a particularly suitable gas for the purpose since it contains both oxygen and hydrogen.

Suitable heating means (not shown) is provided for maintaining the electrodes at predetermined temperatures. This means can comprise any suitable heater, and in the etching of aluminum, electrodes 11, 12 have been maintained at temperatures on the order of 75°–125° and 75°–135° C., respectively.

Operation and use of the apparatus, and therein the method of the invention, can be now described in connection with the etching of aluminum layer 31 on semiconductor wafer 27. It is assumed that wafer 27 and dielectric member 26 have been placed in chamber 13, as shown, and that electrodes 11, 12 are at temperatures on the order of 75°–125° C. and 75°–135° C., respectively. Valves 17 and 39 are closed, and pump 18 is actuated to reduce the pressure in the chamber to a base pressure substantially below 0.1 torr. Valve 17 is then opened to supply the reagent gas to the chamber at a suitable flow rate such as 49–70 cc/min, whereby the pressure in the chamber is raised to a working level on the order of 0.1 torr. The electrodes are then energized to ionize the gas and form a plasma which does the etching. As noted above, the glow discharge is spread uniformly between the electrode, and the wafer can be placed anywhere within this region.

It has been found that the etching process can be enhanced even further by etching in cycles and allowing an oxygen-containing species to build up on the exposed aluminum surfaces between etching periods. The number and length of the cycles is dependent upon the thickness of the aluminum to be removed and the content of other materials in the aluminum. However, it has been found that 3–5 etching periods of 3–3½ minutes each are satisfactory for most wafers.

In the cycling process, the ionizing current is allowed to remain on for a period on the order of 3–3½ minutes, following which the current is turned off and valve 17 is closed to prevent the passage of further reagent gas to the chamber. Pump 18 continues to run until the pressure in the chamber returns to the base level below 0.08 torr, following which the pump is turned off. Valve 39 is then opened to admit air or another suitable oxidizing gas to the chamber. The air is admitted at a suitable rate and for a suitable time to allow the oxygen containing species to build up on the exposed surfaces of the aluminum. With a chamber having a volume on the order of 300 cc, suitable results have been obtained by admitting air at a rate of 300 cc per minute for a period on the order of 45 seconds. Following the admission of air, valve 39 is closed, and pump 18 is again actuated to reduce the pressure in the chamber to the base level. Valve 17 is reopened, and the electrodes are re-energized to begin the next cycle.

EXAMPLE

Utilizing the techniques described above, an aluminum layer having a thickness on the order of 10,000 Å has been removed from a semiconductor wafer in 3 cycles, each comprising an etching period of 3½ minutes and an oxidizing period of 45 seconds. The chamber had a volume on the order of 300 cc, and $CCl_4$ was used as the reagent gas, with a residence time on the order of 1/25 second. During the oxidizing periods, air was admitted to the chamber at a rate of 300 cc per minute. The working pressure in the chamber was 0.08 torr, and the upper and lower electrodes were maintained at temperatures of 75° C. and 125° C., respectively. Generator 21 operated at a frequency of 13.56 MHz and a power level of 50 watts, and electrodes 11, 12 were separated by a distance of 0.4 inch.

The apparatus shown in FIG. 2 includes a chamber 51 having walls 52 fabricated of a suitable material such as aluminum. A removable closure (not shown) permits wafers to be placed within and removed from the chamber. Generally parallel planar electrodes 53, 54 are mounted in the chamber and connected to a source 56 of R.F. energy, located outside the chamber. An insulative glass plate 50 is disposed between electrode 53 and top wall 52, and additional glass plates 55 extend along the edges of plate 50 and electrode 53. Electrode 54 is preferably formed with passageways through which water or another suitable coolant can be circulated to maintain that electrode at a relatively low temperature.

An inlet 57 is located toward one end of the chamber for introducing gas into the chamber, and an exhaust pump 58 is connected to an outlet 59 toward the other end of the chamber. With this arrangement, gas enters the chamber toward one end, flows between the electrodes and exits toward the other end. Other gas flows can be utilized if desired, for example, the gas can be introduced through the lower electrode, directly into the region between the electrodes.

Means is provided for distributing the ionizing current and therefore the active species of the plasma in the region between the electrodes. This means includes glass plates 61, 62 adjacent to upper electrode 53. As illustrated, plate 61 is a solid glass plate having its upper surface adjacent to the lower surface of the electrode, and plate 62 is a perforated glass plate having its upper surface adjacent to the lower surface of plate 61. The perforations or openings 63 extend vertically through plate 62 and form areas of reduced impedance which serve to concentrate the plasma in the regions below the openings. The size of the openings is not critical, and satisfactory results have been obtained with openings having a diameter on the order of one half of the diameter of the wafers. In one preferred embodiment suitable for etching three inch wafers, the plates are rectangular plates on the order of 24 inches long and 12 inches wide, plate 61 is on the order of ⅛ inch thick, plate 62 is on the order of ⅜ inch thick, and the openings are on the order of 1½ inches in diameter. Wafers 64 rest on the upper surface of electrode 54 in axial alignment with the openings, and the spacing between the lower surface of electrode 53 and the upper surface of electrode 54 is on the order of 1 inch.

A typical structure for wafers 64 is illustrated in FIG. 3, and includes a substrate 66 of semiconductor material such as silicon in which regions of suitable impurity are formed in a conventional manner. A layer 67 of insulative material such as $SiO_2$ overlies the substrate, and a layer 68 of aluminum is formed on the $SiO_2$. The aluminum extends through windows 69 in the $SiO_2$ layer to form contacts with the silicon substrate, and a mask 71 of photoresist is formed on the aluminum to define a lead pattern to be formed by etching away exposed portions of the aluminum.

Suitable reagent gases for etching aluminum in the apparatus of FIG. 2 include chlorine and chlorine containing hydrocarbons such as $CCl_4$. With wafers of the type shown in FIG. 3, wherein portions of the aluminum are in direct contact with the silicon, it has been found that improved results can be obtained either by placing a plate of quartz below the wafers on electrode 54 or by using a reagent gas which contains helium or another heat conductive inert gas. Particularly good results have been obtained with a mixture containing 110 parts $CCl_4$ and 40 parts helium by volume.

Operation and use of the apparatus of FIG. 2 in etching aluminum to form lead patterns on wafers of the type shown in FIG. 3 is as follows. After the wafers are placed on electrode 54, the chamber is closed, and pump 58 is actuated to reduce the pressure in the chamber to an initial level on the order of 0.10–0.50 torr. Prior to etching, an oxygen plasma is formed in the chamber for the purpose of eliminating any water which may be present. This plasma is typically maintained for a period on the order of 30 seconds. Thereafter, the reagent gases are admitted, and the etching plasma is formed. This plasma is maintained for a period of time sufficient to etch through the aluminum, typically 5–7 minutes per micron of aluminum with a plasma containing a mixture of $CCl_4$ introduced at a flow rate of 110 cc per minute and helium introduced at a flow rate of 40 cc per minute. With a reactor having the dimensions described above, the electrodes are typically energized to a power level on the order of 1,000–1,100 watts, and lower electrode 54 is maintained at a temperature below 30° C. The pressure in the chamber during the etching process is typically on the order of 0.29 torr. After the etching process is completed, a second oxygen plasma is formed to remove any chlorine residuals. This plasma is typically maintained for a period on the order of two minutes. Thereafter, the system is purged with a dry inert gas such as argon, following which the chamber is opened and the etched wafers are removed. Before another batch of wafers is processed, the surface of the lower electrode is preferably cleaned with acetone.

The process and apparatus of the invention have a number of important features and advantages. The close electrode spacing and relatively high impedance in series with the plasma tend to spread the ionizing current throughout the plasma, resulting in a more uniform plasma. In the etching of aluminum, the cycling process permits overetching without undercutting and results in faster, cleaner removal of the aluminum. The glow discharge of the plasma fills substantially the entire region between the electrodes, and the reaction can be carried out anywhere in this region.

While the invention has been described with specific reference to a process for etching aluminum on semiconductor wafers, it will be understood that it can be utilized with any chemical reaction carried out in the glow discharge region of a plasma.

It is apparent from the foregoing that a new and improved plasma reactor and process have been provided. While only certain presently preferred embodiments have been described, as will be apparent to those familiar with the art, certain changes and modifications can be made without departing from the scope of the invention as defined by the following claims.

What is claimed is:

1. In a process for etching aluminum, the steps of: providing a pair of spaced apart electrodes, placing a dielectric member between the electrodes, placing the aluminum to be etched between the dielectric member and one of the electrodes, introducing a reagent gas into the region between the electrodes, cyclically energizing and deenergizing the electrodes to periodically ionized the gas thereby form a plasma for etching the aluminum, and introducing a gas selected from the group consisting of an oxidizing gas, a reducing gas or a combination thereof into the region between the electrodes while the electrodes are deenergized.

2. The process of claim 1 wherein the last named gas is air.

3. In a process for etching aluminum on a semiconductor wafer in a chamber having a pair of spaced apart generally parallel electrodes, the steps of: placing a plate of dielectric material between the electrodes, placing the wafer between the dielectric plate and one of the electrodes, reducing the pressure in the chamber to a predetermined level, passing a reagent gas selected from the group consisting of chlorine, $CCl_4$, and a chlorine containing hydrocarbon through the chamber at a predetermined rate, energizing the electrodes for a predetermined time to ionize the gas and thereby form a plasma between the electrodes, deenergizing the electrodes and interrupting the passage of the reagent gas to the chamber after the predetermined time, increasing the pressure in the chamber while the electrodes are deenergized, admitting an additional gas selected from the group consisting of an oxidizing gas, a reducing gas or a combination thereof into the chamber while the electrodes are deenergized, reducing the pressure in the chamber to the predetermined level after the additional gas has been admitted, passing the reagent gas through the chamber at the predetermined rate, and reenergizing the electrodes for the predetermined time.

4. The process of claim 3 wherein the predetermined level of pressure is below 0.1 torr.

5. The process of claim 3 wherein the predetermined time is on the order of 3½ minutes.

6. The process of claim 3 wherein the additional gas is air.

7. The process of claim 3 wherein the predetermined reagent gas flow rate and the volume of the chamber are such that the residence time of the reagent gas in the chamber is on the order of 1/25 second.

8. In plasma etching apparatus: means defining an etching chamber, a pair of spaced apart electrodes for producing an electric field within the chamber when energized, means for introducing a reagent gas into the chamber, means for energizing the electrodes to ionize the gas and thereby form a plasma in the region between the electrodes, and a generally planar dielectric member having openings therein positioned between the electrodes for concentrating the plasma in predetermined portions of the region between the electrodes, and means for supporting a material to be etched between the electrodes and spaced axially from the openings in the dielectric member.

9. The apparatus of claim 8 wherein the openings extend through one major surface of the dielectric member to a depth greater than one-half of the thickness of the member.

10. In a process for etching aluminum in a plasma reactor having a pair of spaced apart electrodes and a distributed impedance between the electrodes, the steps of: introducing into the reactor chamber a reagent gas selected from the group consisting of chlorine, $CCl_4$, a chlorine containing hydrocarbon, or a combination thereof, maintaining a pressure on the order of 0.05–0.5 torr in the chamber, energizing the electrodes with an ionizing current to excite the gas and form a plasma containing at least one chemically active species, the distributed impedance having a greater impedance to the ionizing current than the plasma and serving to distribute the current and the plasma substantially throughout the region between the electrodes, and positioning the aluminum in the region between the electrodes in direct contact with the plasma as it is being formed.

11. In a gas plasma reactor: first and second spaced apart electrodes forming oppositely disposed walls of a reaction chamber, an electrically insulative wall extending between the electrodes and forming an additional wall of the reaction chamber, means for introducing a reagent gas into the chamber, means for applying an ionizing current to the electrodes to excite the gas and form a plasma in the chamber, and a dielectric member overlying the first electrode and abutting against the insulative wall to completely isolate the first electrode from the portion of the chamber in which the plasma is formed, the dielectric member having a greater impedance to the ionizing current than the plasma formed between the electrodes whereby the ionizing current and plasma are distributed throughout substantially the entire region between the dielectric member and the second electrode.

12. The reactor of claim 11 wherein the spacing between the electrodes is sufficiently small that the impedance of the plasma to the ionizing current directly between the central portions of the electrodes is substantially less than the impedance of a path from the central portions outwardly along the electrodes and across the insulative wall between the electrodes.

13. In a plasma etching reactor: means defining an enclosed reaction chamber, first and second spaced apart electrodes mounted in the chamber, means for introducing a reagent gas into the chamber, means for energizing the electrodes with an ionizing current to excite the gas and form a plasma in the region between the electrodes, means for distributing the ionizing current and the plasma substantially throughout the region between the electrodes, said means comprising a layer of dielectric material surrounding and enclosing the first electrode with an impedance to the ionizing current substantially greater than the impedance of the plasma whereby the current and plasma distribution are determined largely by the dielectric material, and means for holding the material to be etched in the region between the dielectric material and the second electrode.

14. The reactor of claim 13 wherein the spacing between the electrodes is sufficiently small that the impedance of the plasma to the ionizing current directly between the central portions of the electrodes is substantially less than the impedance of a path from the central portions outwardly along the electrodes and across the insulative wall between the electrodes.

15. The reactor of claim 13 wherein the dielectric material has openings defining areas of reduced impedance for concentrating the ionizing current and the plasma in regions aligned with the openings.

16. In a process for etching aluminum in a plasma reactor having a pair of spaced apart electrodes and a distributed impedance between the electrodes, the steps of: introducing into the reactor chamber a reagent gas containing on the order of 110 parts $CCl_4$ and 40 parts He, maintaining a pressure on the order of 0.05–0.5 torr in the chamber, energizing the electrodes with an ionizing current to excite the gas and form a plasma containing at least one chemically active species, the distributed impedance having a greater impedance to the ionizing current than the plasma and serving to distribute the current and the plasma substantially throughout the region between the electrodes, and positioning the aluminum in the region between the electrodes in direct contact with the plasma as it is being formed.

* * * * *